United States Patent
Park

(10) Patent No.: US 7,359,239 B2
(45) Date of Patent: Apr. 15, 2008

(54) NON-VOLATILE MEMORY DEVICE HAVING UNIFORM PROGRAMMING SPEED

(75) Inventor: Hee Sik Park, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 131 days.

(21) Appl. No.: 11/288,686

(22) Filed: Nov. 28, 2005

(65) Prior Publication Data

US 2006/0250846 A1    Nov. 9, 2006

(30) Foreign Application Priority Data

May 3, 2005    (KR) .................. 10-2005-0037096

(51) Int. Cl.
*G11C 16/04*    (2006.01)

(52) U.S. Cl. .................... 365/185.02; 365/185.05; 365/185.16; 365/185.17; 365/185.24

(58) Field of Classification Search ........... 365/185.02, 365/185.03, 185.16, 185.17
See application file for complete search history.

(56) References Cited

U.S. PATENT DOCUMENTS

| | | | |
|---|---|---|---|
| 5,262,984 A * | 11/1993 | Noguchi et al. ....... | 365/185.03 |
| 5,278,785 A * | 1/1994 | Hazani .................. | 365/185.16 |
| 5,296,801 A * | 3/1994 | Ohtsuka et al. ........... | 323/313 |
| 5,621,684 A | 4/1997 | Jung | |
| 5,642,480 A * | 6/1997 | Brownlee et al. ............. | 726/26 |
| 6,115,315 A * | 9/2000 | Yoshida ................. | 365/230.03 |
| 6,493,262 B1 * | 12/2002 | Wald et al. ............ | 365/185.15 |
| 6,543,036 B1 * | 4/2003 | Iyer et al. ...................... | 716/6 |
| 6,591,327 B1 * | 7/2003 | Briner et al. ............... | 711/103 |
| 6,643,188 B2 | 11/2003 | Tanaka et al. | |
| 6,762,953 B2 * | 7/2004 | Tanizaki et al. ............ | 365/158 |
| 6,771,536 B2 | 8/2004 | Li et al. | |
| 6,859,395 B2 | 2/2005 | Matsunaga et al. | |
| 2003/0048660 A1 * | 3/2003 | Nguyen et al. ......... | 365/185.11 |
| 2003/0095448 A1 * | 5/2003 | Ichige et al. ................ | 365/200 |
| 2003/0137877 A1 * | 7/2003 | Mokhlesi et al. ....... | 365/185.19 |
| 2004/0047204 A1 * | 3/2004 | Hung et al. .................. | 365/202 |
| 2004/0130946 A1 * | 7/2004 | Uribe et al. ........... | 365/185.03 |

FOREIGN PATENT DOCUMENTS

TW    471155 B    1/2002

* cited by examiner

*Primary Examiner*—Ly Duy Pham
(74) *Attorney, Agent, or Firm*—Townsend and Townsend and Crew, LLP

(57) ABSTRACT

Flash memory devices having a cell string structure. According to the present invention, the size of a first group of memory cells connected to a first word line and a second group of memory cells connected to a last word line is formed greater than that of a third group of memory cells respectively connected to the remaining word lines other than the first and last word lines. Accordingly, the program speed of the first and second groups of the memory cells can be improved.

14 Claims, 4 Drawing Sheets

NON-VOLATILE MEMORY DEVICE HAVING UNIFORM PROGRAMMING SPEED

BACKGROUND

1. Field of the Invention

The present invention relates to flash memory devices, and more specifically, to NAND-type flash memory devices having a uniform program speed.

2. Discussion of Related Art

A flash memory is a type of non-volatile memory that can maintain data when power is off and can be electrically programmed and erased. It does not need a refresh function of rewriting data on a predetermined cycle. In this case, the term "program" refers to an operation of writing data into memory cells, and the term "erase" refers to an operation of erasing data from a memory. This flash memory device can be largely classified into a NOR-type and a NAND type depending on the structure and operation condition of cells. In the NOR-type flash memory, the source of each memory cell transistor is connected to a ground terminal (VSS), and program and erase can be performed on a predetermined address. The NOR-type flash memory has been usually used for fields requiring a high-speed operation. On the other hand, in the NAND-type flash memory, a plurality of memory cell transistors is serially connected to form one string, and one string is connected to the source and drain. The NAND-type flash memory has been usual used for fields such as high-integration data retention.

FIG. 1 is a layout diagram showing the configuration of a unit cell string of a common NAND-type flash memory device.

Referring to FIG. 1, a unit cell string of the NAND-type flash memory device includes a source select transistor SST connected to a common source line (not shown), a drain select transistors DST connected to a bit line (not shown), and memory cells MC0 to MC31 serially connected between the source select transistor SST and the drain select transistors DST. Furthermore, the gate of the drain select transistors DST is connected to a drain select line DSL, the gate of the source select transistor SST is connected to a source select line SSL, and the gates of the memory cells MCC1 to MC31 are connected to word lines WL0 to WL31, respectively. In this case, the number of the memory cells MC serially connected between the source select transistor SST and the drain select transistors DST is 16, 32, or 64 in consideration of a device and density.

In the unit cell string structure as shown in FIG. 1, the program speed of the memory cells MC0 and MC31 connected to the first and last word lines WL0 and WL31 is slower than that of the remaining memory cells MC1 to MC30. This is because the first word line WL0 is adjacent to the source select line SSL and the last word line WL31 is adjacent to the drain select line DSL.

To be more specific, in a program operation, a program prohibit voltage (Vpass) is applied to non-selected word lines, whereas the ground voltage (VSS) is applied to the source select line SSL and the power supply voltage (VCC) is applied to the drain select line DSL. If so, the memory cells MC0 and MC31 experience interference by a voltage of the source select transistor SST and the drain select transistors DST, so that the program speed of the memory cells MC0 and MC31 becomes slower than that of the remaining memory cells MC1 to MC30.

FIG. 2 is a graph showing a threshold voltage depending on each word line in FIG. 1. A low threshold voltage corresponds to a slow program speed.

From FIG. 2, it can be seen that the threshold voltage (Vt) of the memory cell MC31 connected to the last word line WL31 that is the nearest to the drain select line DSL is the lowest, and the threshold voltage (Vt) of the memory cell MC0 connected to the first word line WL0 that is the nearest to the source select line SSL is the second lowest.

As described above, if the threshold voltage of particular memory cells (for example, MC0 and MC31 adjacent to DST and SST) is lower than that of the remaining memory cells MC1 to MC30, the program speed of the NAND-type flash memory device becomes non-uniform and distribution of the threshold voltage with a chip widens. This results in a degraded performance of the NAND-type flash memory devices.

SUMMARY OF THE INVENTION

An advantage of the present invention is a NAND-type flash memory device in which the program speed can be improved for a first group of memory cells connected to word lines that are the nearest to a source select line and a second group of memory cells connected to word lines that are the nearest to a drain select line of the memory cells respectively connected to the word lines.

Another advantage of the present invention is a NAND-type flash memory device in which the program speed can be improved for memory cells connected to the last word line that is the nearest to a drain select line of the memory cells respectively connected to the word lines.

According to one embodiment of the present invention, there is provided a non-volatile memory device, including first select transistors, each connected to a plurality of bit lines, second select transistors connected to a common source line, and a plurality of memory cells respectively connected between the first select transistors and the second select transistors in series and connected to the plurality of word lines, respectively. In this case, the size of a first group of memory cells connected to a first word line and a second group of memory cells connected to a last word line, of the plurality of word lines, is greater than that of a third group of memory cells connected to the remaining word lines, respectively, other than the first and last word lines.

According to another embodiment of the present invention, there is provided a NAND-type flash memory device, including first select transistors, each connected to a plurality of bit lines, second select transistors connected to a common source line, and a plurality of memory cells respectively connected between the first select transistors and the second select transistors in series and connected to the plurality of word lines, respectively. In this case, the size of the first group of the memory cells connected to a last word line, of the plurality of word lines, is greater than that of the second group of the memory cells respectively connected to the remaining word lines other than the last word line.

A non-volatile memory device includes a first select transistor coupled to a bit line; a second select transistor coupled to a common source line; and a plurality of memory cells coupled in series and in an array between the first select transistor and the second select transistor, each memory cell coupled to a word line, the memory cells defining a first memory cell that is provided on one end of the array and having a first memory cell size, a last memory cell that is provided in an opposing end of the array and having a second memory cell size, and remaining memory cells provided between the first and last memory cells, each of the remaining memory cells having a third memory cell size;

wherein both of the first and second memory cell sizes are greater than the third memory cell size.

The first memory cell size is at least 10% greater than the third memory cell size, and the second memory size cell is at least 12% greater than the third memory cell size, so that threshold voltages associated with first and last memory cells are increased to improve the uniformity of a program operation speed of the memory cells and decrease a program threshold distribution.

A NAND-type flash memory device includes a first select transistor coupled to a bit line; a second select transistor coupled to a common source line; and a plurality of memory cells in an array coupled in series between the first select transistor and the second select transistor, each memory cell coupled to a word line, wherein a first group of the memory cells have a different cell size than that of a second group of the memory cells.

A non-volatile memory device includes a first select transistor coupled to a bit line; a second select transistor coupled to a common source line; and a plurality of memory cells coupled in series and in an array between the first select transistor and the second select transistor, each memory cell coupled to a word line, the memory cells defining a first memory cell that is provided on one end of the array and having a first memory cell size, a second memory cell that is provided in an opposing end of the array and having a second memory cell size, and remaining memory cells provided between the first and second memory cells, each of the remaining memory cells having a third memory cell size, wherein both of the first and second memory cell sizes are greater than the third memory cell size.

DETAILED DESCRIPTION OF PREFERRED EMBODIMENTS

Embodiments in accordance with the present invention will be described with reference to the accompanying drawings. Since these embodiments are provided for the purpose that those ordinary skilled in the art are able to understand the present invention, they may be modified in various manners so that the scope of the present invention is not limited by the embodiments described later.

Figure 3:
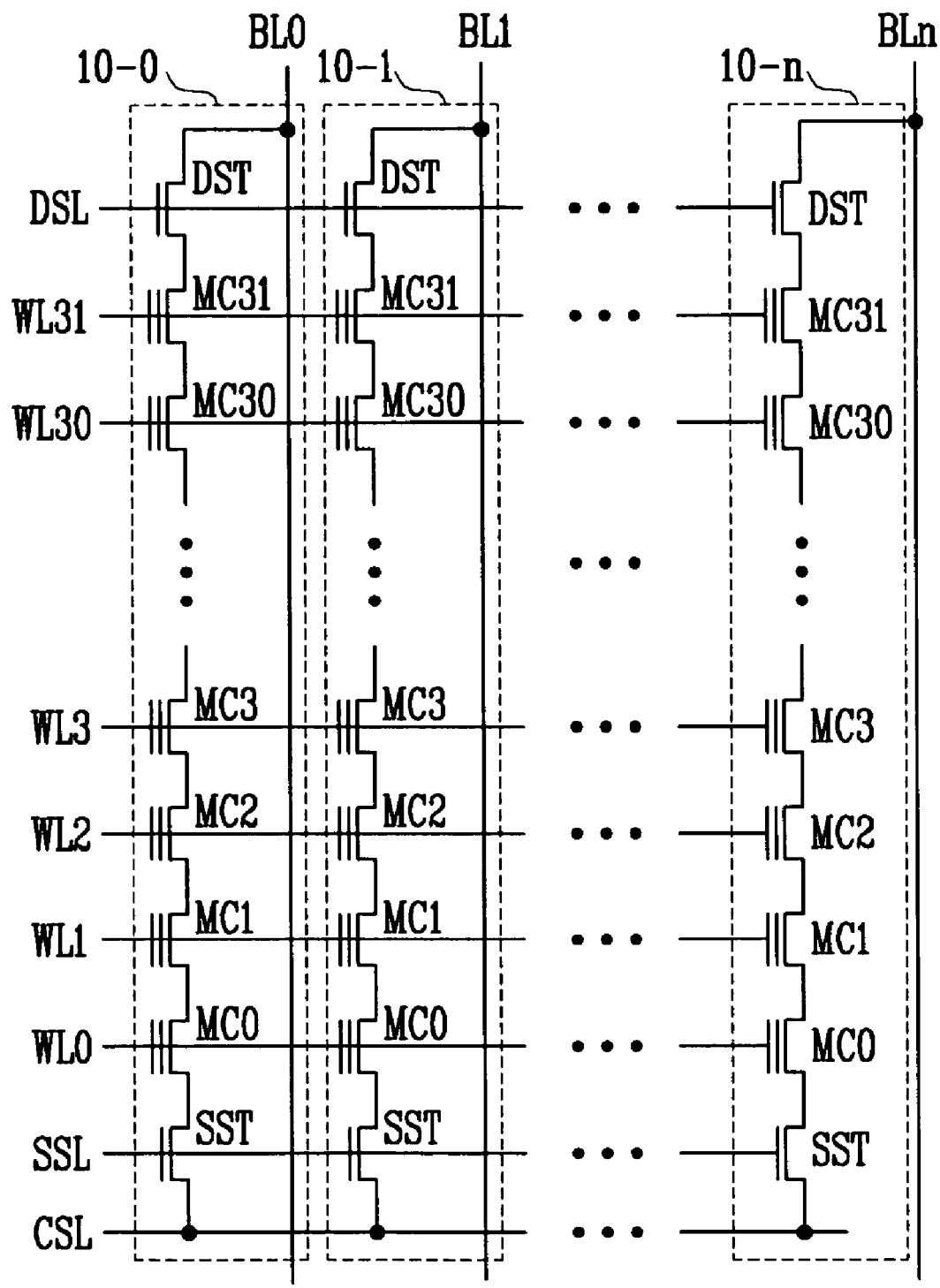
FIG. 3 is a circuit diagram of a NAND-type flash memory device according to the present invention.

FIG. 3 is an overall cell string structure of a NAND-type flash memory device according to the present invention.

Referring to FIG. 3, the NAND-type flash memory device includes N number of cell strings 10-0 to 10-n in which 32 memory cells form one string.

A memory cell (e.g., MC0) is controlled by one word line WL0 and forms one page, i.e. a group of memory cells. Each of the cell strings 10-0 to 10-n includes a source select transistor SST connected to a common source line CSL, drain select transistors DST connected to bit lines BL0 to BLn, respectively, and memory cells MC0 to MCn con-nected between the source select transistors SST and the drains of the transistors DST. Furthermore, the gate of each of the drain select transistors DST is connected to the drain select line DSL, the gate of the source select transistors SST is connected to the source select line SSL, and the gates of the memory cells MC0 to MC31 are connected to first to thirty-first word lines WL0 to WL31.

In this case, memory cells such as 8, 16, 32, or 64 in number are connected between the source select transistors SST and the drain select transistors DST in series.

Figure 4:
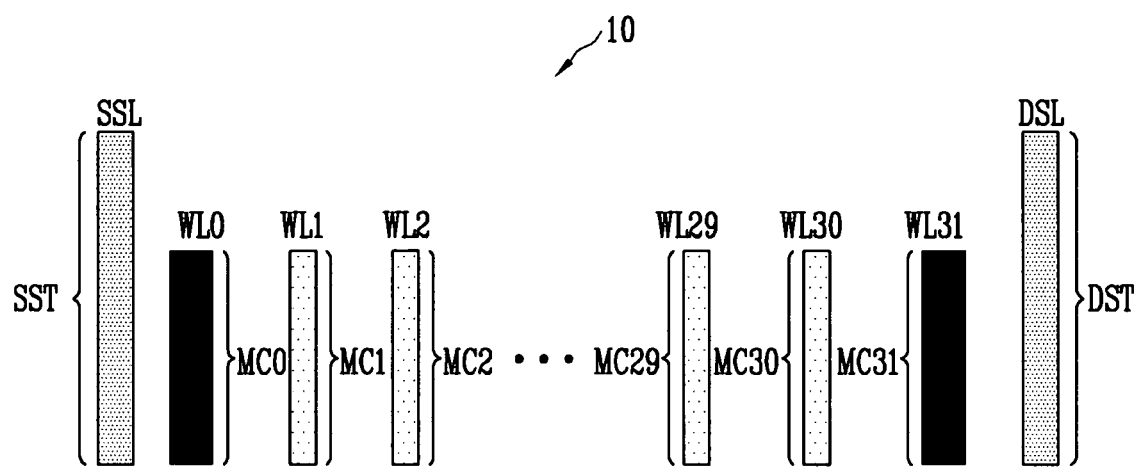
FIGS. 4 and 5 are layout diagrams showing the configuration of a unit cell string shown in FIG. 3.
Figure 5:
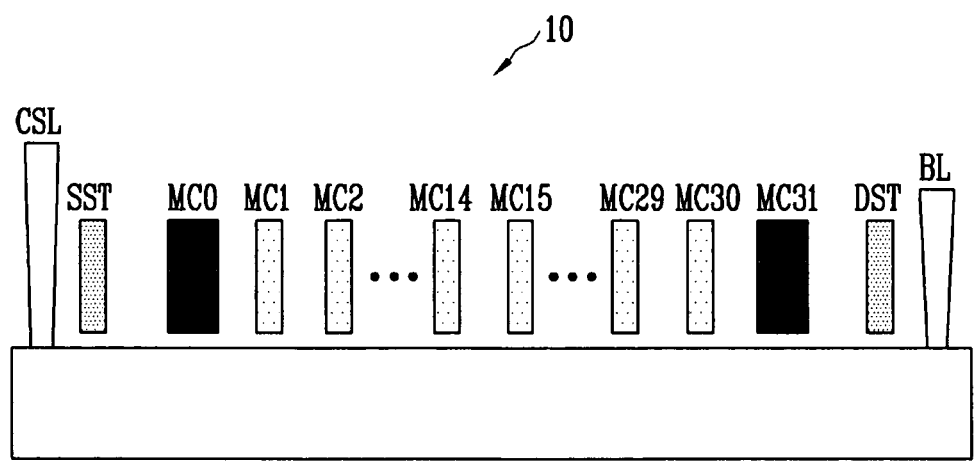

FIGS. 4 and 5 are a layout diagram of one cell string of the cell strings 10-0 to 10-n of the NAND-type flash memory device shown in FIG. 3 and a process sectional view thereof according to one embodiment of the present invention.

As shown in FIGS. 4 and 5, a distance between the word lines is the same, but the size of the memory cell MC0 to MC31 is not the same. The memory cell MC31 connected to the last word line WL31 that is the nearest to the drain select line DSL and the memory cell MC0 connected to the word line WL0 that is the nearest to the source select line SSL are greater than the remaining memory cells MC1 to MC30. The reason is for improving the program speed of the memory cell MC0 connected to the first word line WL0 and the memory cell MC31 connected to the last word line WL31.

If the size of the memory cell MC31 connected to the last word line WL31 that is the nearest to the drain select line DSL and the memory cell MC0 connected to the word line WL0 that is the nearest to the source select line SSL is large, the threshold voltage (Vt) of the memory cells MC0 and MC31 becomes high. It is thus possible to prevent the program speed of the memory cells MC0 and MC31 from relatively becoming slower than that of the remaining memory cells MC1 to MC30.

According to one embodiment of the present invention, the size of memory cell MC31 connected to the last word line WL31 is at least about 12% to 15% greater than the size of the remaining memory cells MC1 to MC30. The size of memory cell MC0 connected to the first word line WL0 is at least about 10% to 13% greater than the size of the remaining memory cells MC1 to MC30. In one embodiment, the size of memory cell MC31 is at least 20% or 25% greater than that of the memory cells MC1-MC30, and the size of memory cell MC0 is at least 15% or 20% greater than that of the memory cells MC1 to MC30.

As described above, if the size of the memory cells MC0 and MC31 connected to the first and last word lines WL0 and WL31 is greater than that of the remaining memory cells MC1 to MC30, the threshold voltage (Vt) of the memory cells MC0 and MC31 becomes high like the remaining memory cells MC1 to MC30. The distribution of the whole program threshold voltage becomes narrow. If the threshold voltage (Vt) of the cells MC0 and MC31 increases, the program speed of the memory cells MC0 and MC31 increases. Thus, the program speed of these cells MC0 and MC31 becomes similar to that of the remaining memory cells MC1 to MC30.

In FIGS. 4 and 5, the word line WL0 that is the nearest to the source select line SSL is the first word line. If the word line WL0 adjacent to the source select line SSL is the last word line and the word line WL31 adjacent to the drain select line DSL is the first word line, the size of memory cell MC0 connected to the word line WL0 is at least about 12% to 15% greater than the size of remaining memory cells MC1 to MC30, and the size of memory cell MC31 connected to the word line WL31 is at least about 10% to 13% greater than the size of remaining memory cells MC1 to MC30. In one embodiment, the size of memory cell MC31 is at least 20% or 25% greater than that of the memory cells MC1-MC30, and the size of memory cell MC0 is at least 15% or 20% greater than that of the memory cells MC1 to MC30.

Figure 6:
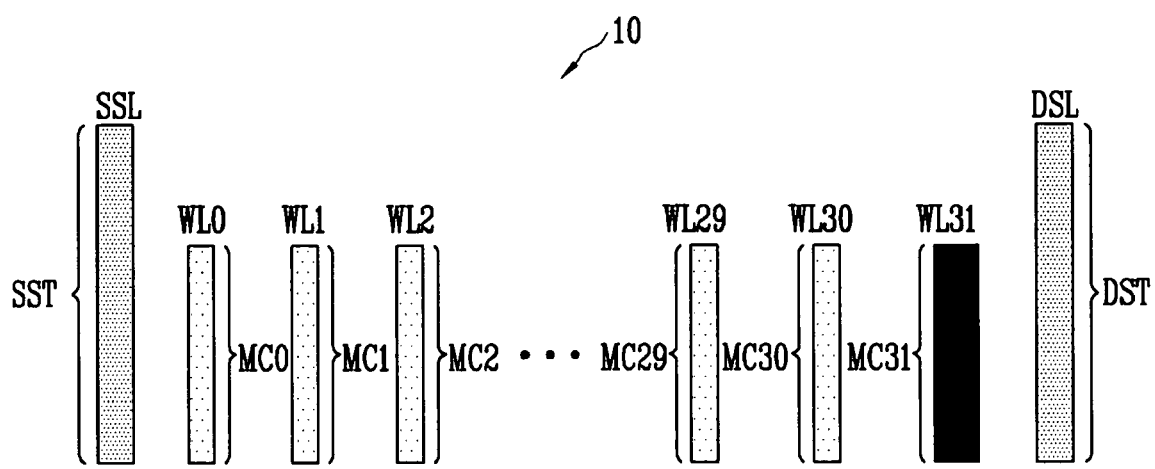
FIGS. 6 and 7 are process sectional views of the unit cell string shown in FIG. 3.
Figure 7:
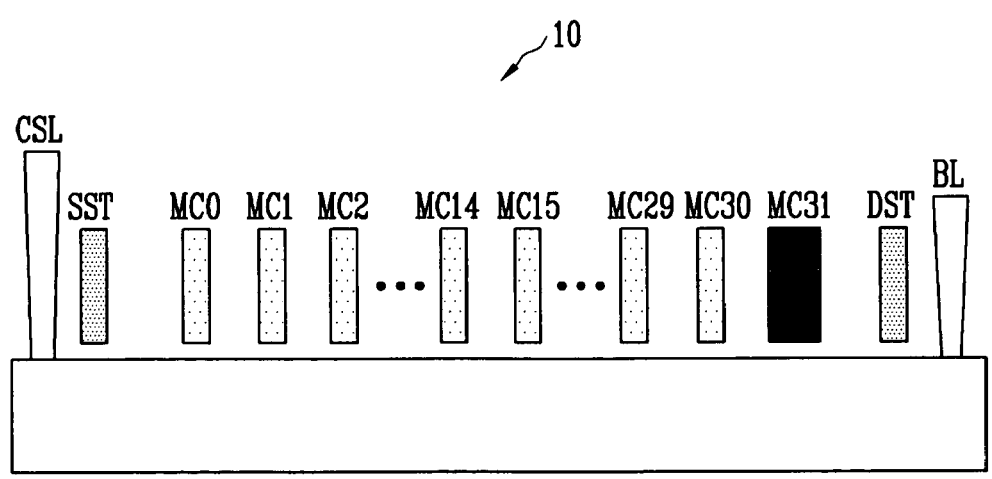

FIGS. 6 and 7 are a layout diagram of one cell string of the cell strings 10-0 to 10-n of the NAND-type flash memory device shown in FIG. 3 and a process sectional view thereof according to another embodiment of the present invention.

As shown in FIGS. 6 and 7, a distance between the word lines is the same, but the size of the memory cells MC0 to MCn is not the same. The size of the memory cell MC31 connected to the word line WL31 that is the nearest to the drain select line DSL is greater than that of the remaining memory cells MC0 to MC30. The reason is for improving the program speed of the memory cell MC31 connected to the last word line WL31.

If the size of the memory cell MC31 connected to the word line WL31 that is the nearest to the drain select line DSL is large, the threshold voltage (Vt) of the memory cell MC31 increases. It is thus possible to prevent the program speed of the memory cell MC31 from becoming relatively slower than that of the remaining memory cells MC0 to MC30.

According to another embodiment of the present invention, the size of memory cell MC31 connected to the last word line WL31 is about 12% to 15% greater than the size of remaining memory cells MC0 to MC30.

As described above, if the size of the memory cell MC31 connected to the word line WL31 that is the nearest to the drain select line DSL is greater than that of the remaining memory cells MC0 to MC30, the threshold voltage (Vt) of the memory cell MC31 increases and distribution of the whole program threshold voltage becomes narrow. That is, if the threshold voltage of the memory cell MC31 increases, the program speed of the memory cell MC31 becomes high. Thus, the program speed of the memory cell MC31 becomes similar to that of the remaining memory cells MC0 to MC30.

Figure 1:
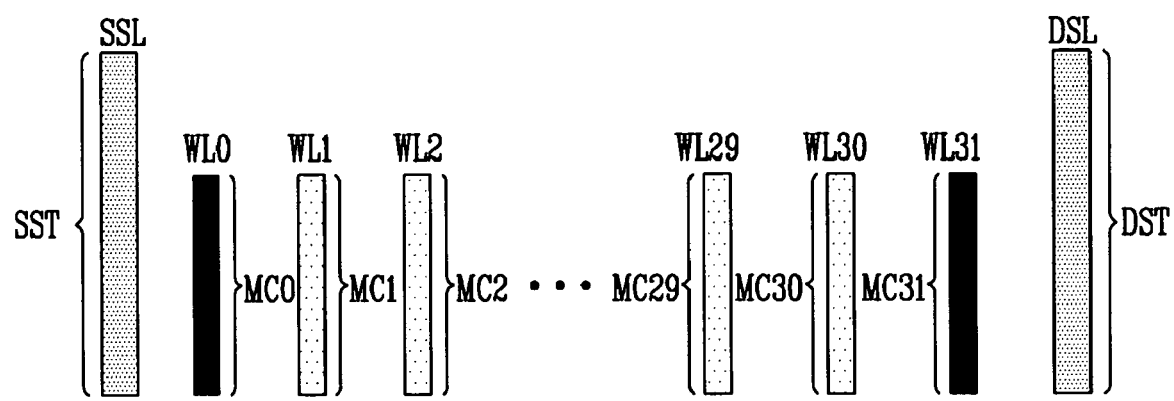
FIG. 1 is a layout diagram showing the configuration of a unit cell string of a common NAND-type flash memory device.
Figure 2:
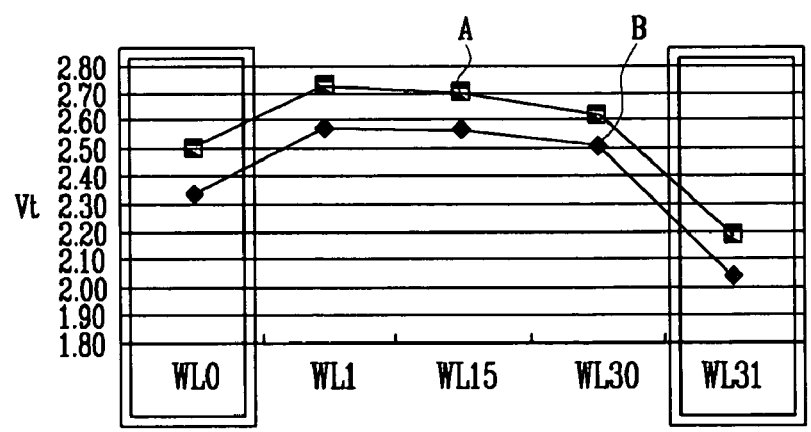
FIG. 2 is a graph showing a threshold voltage depending on each word line in FIG. 1.

In FIGS. 6 and 7, only the size of the memory cell MC31 connected to the word line WL31 that is the nearest to the drain select line DSL is formed greater than that of the remaining memory cells. Even in this case, the distribution of the program threshold voltage can be significantly reduced. This is because the memory cell MC31 connected to the last word line WL31 has a threshold voltage much lower than that of the remaining memory cells, as shown in FIG. 2.

In FIGS. 6 and 7, the word line WL31 that is the nearest to the drain select line DSL is the last word line. If the word line WL31 adjacent to the drain select line DSL is the first word line, the size of memory cell MC0 connected to the word line WL0 is about 12% to 15% greater than the size of remaining memory cells MC1 to MC31.

The present invention is more effective in the case where the number of memory cells in a cell string increases.

Furthermore, the flash memory device of a single level cell has been described above. It is, however, to be understood that the present invention is more effective in a flash memory device of a multi level cell, which employs a faster program speed and narrower program threshold voltage distribution.

As described above, according to the present invention, threshold voltages of memory cells connected to first and last word lines adjacent to a source select line and a drain select line are increased. Accordingly, the program operation speed of the whole memory cells can become uniform and program threshold voltage distribution can be narrow.

Furthermore, threshold voltages of memory cells connected to a last word line adjacent to a source select line or a drain select line is increased. Accordingly, program threshold voltage distribution can become narrow.

What is claimed is:

1. A non-volatile memory device, comprising:
    a first select transistor coupled to a bit line;
    a second select transistor coupled to a common source line; and
    a plurality of memory cells coupled in series and in an array between the first select transistor and the second select transistor, each memory cell coupled to a word line, the memory cells defining a first memory cell that is provided on one end of the array and having a first memory cell size, a last memory cell that is provided in an opposing end of the array and having a second memory cell size, and remaining memory cells provided between the first and last memory cells, each of the remaining memory cells having a third memory cell size,
    wherein both of the first and second memory cell sizes are greater than the third memory cell size.

2. The non-volatile memory device as claimed in claim 1, wherein the first memory cell size is at least 10% greater than the third memory size, and the second memory size is at least 12% greater than the third memory size.

3. The non-volatile memory device as claimed in claim 1, wherein the first memory cell is adjacent to the second select transistor and the second memory cell is adjacent to t he first select transistor.

4. The non-volatile memory device as claimed in claim 1, wherein the first memory cell is adjacent to the first select transistor and the second memory cell is adjacent to the second select transistor.

5. The non-volatile memory device as claimed in claim 1, wherein the plurality of memory cells are a multi-level cell.

6. The non-volatile memory device as claimed in claim 1, wherein the first memory cell size is at least 10% greater than the third memory cell size, and the second memory size cell is at least 12% greater than the third memory cell size, so that threshold voltages associated with first and last memory cells are increased to improve the uniformity of a program operation speed of the memory cells and decrease a program threshold distribution.

7. A non-volatile memory device, comprising:
    a first select transistor coupled to a bit line;
    a second select transistor coupled to a common source line; and
    a plurality of memory cells coupled in series and in an array between the first select transistor and the second select transistor, each memory cell coupled to a word line,
    wherein the cell size of a first group of memory cells is greater than that of a second group of the memory cells, and
    wherein the first group of the memory cells comprises a single memory cell and is nearest to the first select transistor.

8. The non-volatile memory device as claimed in claim 7, wherein the size of the first group of the memory cells is at least 12% greater than the size of the second group of the memory cells.

9. A non-volatile memory device, comprising:
    a first select transistor coupled to a bit line;
    a second select transistor coupled to a common source line; and a plurality of memory cells coupled in series and in an array between the first select transistor and the second select transistor, each memory cell coupled to a word line, wherein the cell size of a first group of memory cells is greater than that of a second group of the memory cells, and wherein the first group of the memory cells is nearest to the second select transistor.

10. The non-volatile memory device as claimed in claim 7, wherein the plurality of memory cells are a multi-level cell.

11. A non-volatile memory device, comprising:
a first select transistor coupled to a bit line;
a second select transistor coupled to a common source line; and
a plurality of memory cells coupled in series and in an array between the first select transistor and the second select transistor, each memory cell being coupled to a word line, the memory cells defining a first memory cell that is the nearest to the first select transistor and having a first memory cell size, a second memory cell that is the nearest to the second select transistor and having a second memory cell size, and remaining memory cells provided between the first and last memory cells, each of the remaining memory cells having a third memory cell size, wherein both of the first and second memory cell sizes are greater than the third memory cell size to increase threshold voltages associated with the first and second memory cells.

12. The non-volatile memory device as claimed in claim 9, wherein the size of the first group of the memory cells is at least 12% greater than the size of the second group of the memory cells.

13. The non-volatile memory device as claimed in claim 9, wherein the first group of the memory cells comprises only a single memory cell and is nearest to the first select transistor.

14. The non-volatile memory device as claimed in claim 9, wherein the plurality of memory cells are a multi-level cell.

* * * * *